(12) United States Patent
Fedynyshyn

(10) Patent No.: US 8,110,339 B2
(45) Date of Patent: Feb. 7, 2012

(54) MULTI-TONE RESIST COMPOSITIONS

(75) Inventor: Theodore H. Fedynyshyn, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 696 days.

(21) Appl. No.: 12/104,486

(22) Filed: Apr. 17, 2008

(65) Prior Publication Data

US 2009/0068589 A1    Mar. 12, 2009

Related U.S. Application Data

(60) Provisional application No. 60/970,282, filed on Sep. 6, 2007.

(51) Int. Cl.
*G03F 7/20* (2006.01)
*G03F 7/213* (2006.01)
*G03F 7/22* (2006.01)
*G03F 7/30* (2006.01)

(52) U.S. Cl. ........ 430/312; 430/311; 430/322; 430/325; 430/326; 430/394; 430/907; 430/910; 430/942

(58) Field of Classification Search ........................ None
See application file for complete search history.

(56) References Cited

U.S. PATENT DOCUMENTS

| | | | |
|---|---|---|---|
| 5,972,570 A | 10/1999 | Bruce et al. | |
| 6,007,968 A | 12/1999 | Furukawa et al. | |
| 6,014,422 A | 1/2000 | Boyd et al. | |
| 6,114,082 A | 9/2000 | Hakey et al. | |
| 6,200,726 B1 | 3/2001 | Chen et al. | |
| 6,338,934 B1 | 1/2002 | Chen et al. | |
| 6,387,783 B1 | 5/2002 | Furukawa et al. | |
| 6,391,529 B2 | 5/2002 | Maeda et al. | |
| 2003/0224283 A1 | 12/2003 | Allen et al. | |
| 2004/0009424 A1 | 1/2004 | Fedynyshyn et al. | |

(Continued)

FOREIGN PATENT DOCUMENTS

| EP | 0 810 477 | 12/1997 |
|---|---|---|
| JP | 23574/1979 | 9/1980 |
| WO | WO 2004/051372 | 6/2004 |

OTHER PUBLICATIONS

CYTEC Product Guide, CYMEL® Amino Resin Crosslinkers for the Coating Industry, Pub. No. 250185E, Version A, Cytec Industries Inc. (2008).

(Continued)

*Primary Examiner* — Sin J. Lee
(74) *Attorney, Agent, or Firm* — Nutter McClennan & Fish LLP; Thomas J. Engellenner; Lydia G. Olson

(57) ABSTRACT

Multi-tone resists can enhance the resolution limit of a lithographic process by advantageously using the changeable solubility of a resist composition as a function of lithographic radiation dosage. By imaging a multi-tone resist with different doses of lithographic radiation in a selected pattern, the pattern can be imparted to the resist upon subsequent development of the resist. In some aspects, a resist composition is utilized having an aliphatic polymer (e.g., a copolymer with fluoropolymer units and/or methacrylate units) with acid labile groups and a plurality of crosslinkable groups that can be crosslinked to other portions of the aliphatic polymer. Other components such as base generators and/or crosslinking agents can also be included. Such compositions can be useful in extending the resolution of UV lithographic radiation processes (e.g., wavelengths less than 200 nm). Other aspects of such compositions and methods are also discussed.

21 Claims, 7 Drawing Sheets

Lateral Position, X

U.S. PATENT DOCUMENTS

| | | | |
|---|---|---|---|
| 2005/0095532 A1* | 5/2005 | Kodama et al. | 430/270.1 |
| 2005/0233242 A1* | 10/2005 | Yamanaka | 430/270.1 |
| 2005/0244740 A1* | 11/2005 | Maruyama et al. | 430/270.1 |
| 2006/0160022 A1 | 7/2006 | Xu et al. | |
| 2007/0218407 A1* | 9/2007 | Mizutani et al. | 430/270.1 |
| 2008/0063989 A1 | 3/2008 | Fedynyshyn et al. | |

OTHER PUBLICATIONS

CYTEC Product Guide, Powder Coating Resins, Pub. No. 220104E, version a, Cytec Industries Inc. (2007).

Holmes, S.J. et al., "Edge Lithography as a Means of Extending the Limits of Optical and Non-Optical Lithographic Resolution," SPIE vol. 3678 (Mar. 1999).

INEOS Melamines, Maprenal® Resimene® Amino Crosslinking Resins for the Coating Industry booklet (available at http://www.ineosmelamines.com/42-Broshure.htm), (2007).

International Search Report, from corresponding PCT/US2008/075201, dated Dec. 19, 2008.

Mertesdor, C. et al., "Microelectonics Technology," pp. 35-55 (1995).

Padmanaban, M. et al., "E-Beam Curing Effects on the Etch and CD-SEM Stability of 193-nm Resists," Proc. of SPIE 4690:606-14 (Mar. 4, 2002).

Roff, W.J. et al., Handbook of Common Polymers, CRC Press sec. 27, pp. 285-298 (1971).

* cited by examiner where R can be any of:

MULTI-TONE RESIST COMPOSITIONS

CROSS REFERENCE TO RELATED APPLICATION

The present application claims the benefit of a U.S. Provisional Patent Application bearing Ser. No. 60/970,282, filed Sep. 6, 2007, the entire contents of which are hereby incorporated by reference herein.

STATEMENT REGARDING FEDERALLY SPONSORED RESEARCH OR DEVELOPMENT

This invention was made with U.S. government support under DARPA/MTO contract no. FA8721-05-C-0002. The government has certain rights in the invention.

FIELD OF THE APPLICATION

The technical field of the present application is directed to lithographically sensitive compositions and methods and, in particular, such compositions and methods capable of exhibiting differential behavior as a function of lithographic radiation dosage.

BACKGROUND

Optical lithography is employed in the fabrication of advanced microelectronic circuits, as well as microfluidic, micro-optical and micromechanical devices. Lithography is typically used to generate patterns in such devices by employing thin films of resist, which change certain critical properties upon exposure to optical radiation. This change either enhances or hinders removal of portions of the resist in subsequent steps.

The ultimate resolution limit in optical lithography is determined by the wave nature of light. The wavelength of the exposure tool determines a minimum length scale over which the intensity pattern projected by the exposure tool into the resist can generate light and dark regions. Resists used in microelectronics are typically designed to respond such that resist retention occurs at a single threshold of time integrated intensity, or exposure dose, resulting in sharp features. For instance, for a sinusoidal intensity modulation in the resist, a single line/space pair is printed with sharp edges for each period of the aerial image. It is also straightforward to show that at the resolution limit of the exposure tool, the patterning resolution cannot simply be doubled by performing a second exposure, translated by half the spatial period, in the same layer of photoresist. The two exposures combine in such a fashion that all spatial information is lost at the resolution limit of the tool.

Because of this limitation, higher feature densities have been typically been achieved by using shorter wavelength exposure sources and/or employing immersion fluids between the final optic and resist (which has the effect of reducing the effective wavelength of the source). Certain advanced lithography schemes envision shrinking the radiation wavelength to less than 20 nm by employing either EUV or x-ray radiation.

Because adopting a shorter wavelength source has brought significant engineering challenges, techniques have been proposed to overcome the optics-imposed resolution limit at a specific wavelength. The simplest conceptually is to pattern and develop sequentially two separate sets of features, each shifted accordingly. For instance, to double the resolution of a grating, two separate gratings can be patterned, each shifted by one-half the period. Over-exposure or over-development techniques can be used to insure the feature size produced from each exposure is below the half-pitch. However, this technique requires separate coating, alignment, exposure, and processing steps.

There exists a need for alternative approaches for overcoming optics-imposed resolution limits. Methods and compositions that can provide better resolution without the need fro multiple coating, alignment or processing steps would satisfy a long felt need in the art.

SUMMARY OF THE INVENTION

Some embodiments of the present invention are drawn toward multi-tone resist compositions. Multi-tone resist compositions can have an absorbance of less than about 10 $\mu m^{-1}$, less than about 5 $\mu m^{-1}$, or less than about 1 $\mu m^{-1}$ for at least one wavelength of electromagnetic radiation below about 200 nm (e.g., at least one wavelength between about 190 nm and about 195 nm, or about 155 nm and about 160 nm). In one aspect of the invention, multi-tone resist compositions are disclosed that have limited solubility in a developer when the composition is exposed to lithographic radiation below a lower selected dosage and above an upper selected dosage.

Multi-tone resist compositions can produce finer patterns with higher resolution than typical single tone resists by utilizing a varying resist solubility as a function of applied lithographic radiation that exhibits two or more threshold transitions (e.g., low solubility to high solubility or visa versa). The multiple thresholds enable features to be patterned on a resist with a shorter period than applied by the lithographic radiation's period. For example, for a dual-tone resist, portions of resist receiving a dose lower than the positive tone threshold level, $E_p$, and portions of resist receiving a dose higher than the negative tone threshold level, $E_n$, are insoluble when contacted with a developer. Portions of the resist receiving a dose between $E_p$ and $E_n$, however, are soluble in developer. This produces a doubling of feature density compared to the period of the aerial image applied to the resist.

Multi-tone resist compositions can include an aliphatic polymer composition and an acid generator. The aliphatic polymer composition, which can be soluble in a developer after the composition is exposed to a selected lithographic radiation, can include acid-labile groups. The aliphatic polymer can also include a plurality of crosslinkable sites having crosslinkable groups, which can be capable of crosslinking the aliphatic polymer composition. Such crosslinking can be activated by an elevated level of lithographic radiation to render the resist composition insoluble, or having very limited solubility, in a developer. In some instances, a crosslinkable group can comprise at least one of a crosslinkable hydroxide and a latent crosslinkable hydroxide (i.e., a group capable of forming a crosslinkable hydroxide via an acid-catalyzed reaction). Aliphatic polymer compositions can be embodied as copolymers (e.g., random or block) having 2 or more repeat units. The resist composition can include a crosslinking agent, which can promote crosslinking of the aliphatic polymer, e.g., at a crosslinkable site of the polymer.

An example of aliphatic polymer is an aliphatic acrylate polymer such as an aliphatic methacrylate portion. Acid labile groups can be placed on the acrylate portion of the polymer, or other portions. Crosslinkable groups can be embodied as alcohol groups on the polymer, or esters susceptible of transesterification. Another example of an aliphatic polymer is a fluoroaliphatic polymer. Fluoroaliphatics can incorporate at least partially fluorinated cyclic groups, which can optionally include the acid labile group, and can also incorporate crosslinkable groups. Other examples include polymers that incorporate both fluorine and acrylate (e.g., methacrylate) groups.

The acid generator can be used to produce an acid when the generator is exposed to lithographic radiation. The resist composition can also include a crosslinking agent capable of reacting with one or more hydroxyl groups to cause crosslinking of the aliphatic polymer. Such compositions can also include additional components, such as base generators, base additives, and other additives to enhance resist performance.

Other embodiments are directed to methods of forming a pattern with a resist to perform lithography. A multi-tone resist, consistent with any of the embodiments disclosed herein, can be applied to a substrate. For instance, the multi-tone resist can comprise an acid generator and an aliphatic polymer with acid labile groups. The aliphatic polymer can also include crosslinkable groups at crosslinkable sites as described in the present application. The multi-tone resist can be formulated to be have limited solubility (e.g., be insoluble) before being subjected to a selected dosage of lithographic radiation above a given threshold, and/or while the acid labile groups are still attached to the aliphatic polymer. As well, the multi-tone resist can be characterized by at least two solubility transitions that are a triggered by threshold values in lithographic radiation dosage. Multi-tone resist compositions can also be formulated to have additional solubility transitions, leading to three-tone, four-tone, and more transition compositions.

In some of these method embodiments, a first portion of the resist can be selectively exposed to a first lithographic radiation dose. The first radiation dose can be characterized as being capable of activating removal of one or more acid labile groups in the multi-tone resist. The exposed first portion of the resist can be substantially soluble in the developer. A second portion of the resist can be selectively exposed to a second lithographic radiation dose. The second radiation dose can be characterized as being capable of inducing crosslinking of an aliphatic polymer at its crosslinkable sites in the resist. Such crosslinking can occur via a number of mechanisms, such as transesterification of an aliphatic polymer in the resist composition, or though the use of a crosslinking agent to bind polymers at their crosslinkable sites. The exposed second portion of the resist can have limited solubility in the developer. The resist can be contacted with the developer to form the pattern.

The steps of selectively exposing portions of the resist to lithographic radiation doses can be performed serially, or in a single lithographic radiation exposure. Lithographic radiation can be characterized by any of electromagnetic radiation, ion beam radiation, and/or electron beam radiation. When electromagnetic radiation is utilized, the radiation can be characterized as having one or more wavelengths below about 200 nm, such as between about 190 nm and 195 nm, or between about 155 nm and 160 nm. Other intermediate dosages of lithographic radiation, which may be lower than the first dose, intermediate between the first and second dose, and/or higher than the second dose, can also be utilized, which can also trigger other solubility changes in the resist composition.

BRIEF DESCRIPTION OF THE DRAWINGS

Aspects of the present invention will be more fully understood from the following detailed description taken in conjunction with the accompanying drawings (not necessarily drawn to scale), in which.

DETAILED DESCRIPTION OF THE INVENTION

Figure 1A:
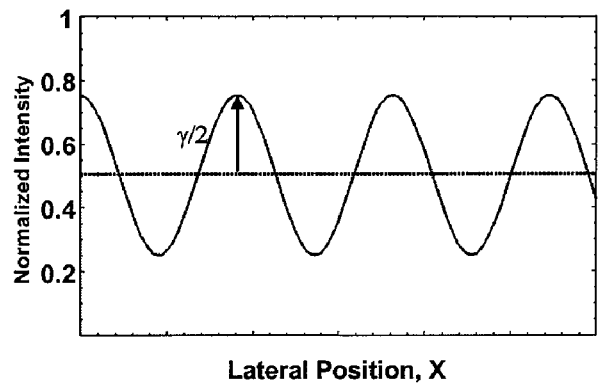
FIG. 1A is a graph of a representative sinusoidal aerial image with contrast, γ used in an embodiment of the invention.

Some embodiments of the invention are directed to methods and materials for enhancing the resolution of a projected image pattern using a multi-tone resist composition. For example, some embodiments describe methods and compositions to both hinder and enhance a resist dissolution rate, possibly multiple times, depending on the doses and nature of the lithographic radiation to which the resist is exposed. By enabling a change in the dissolution rate of the resist more than once as a function of the dose of lithographic radiation imparted, finer patterns (i.e., higher resolution) can be obtained than would be otherwise possible in a single tone resist. In some embodiments, these methods and compositions are especially drawn to use with lithographic radiation characterized with an electromagnetic wavelength below about 200 nm (e.g., about 193 nm, about 157 nm, or EUV), though aspects of the embodiments can also potentially be used at higher wavelengths or with other lithographic radiation techniques (e.g., electron and/or ion beam). In some embodiments, a resist compositions can be utilized that includes an aliphatic polymer, such as a copolymer with acrylate and/or fluoropolymer units, with acid-labile groups and crosslinkable groups.

Characteristics of Multi-Tone Resist Usage

Resist systems often employ an acid generator to indirectly affect the resist dissolution. The acid generator typically produces an acid upon lithographic radiation excitation, which can either make the exposed resist section more soluble or less soluble in a base developer. Such single action acting resists are called single-tone resists herein. Positive tone resists can have their dissolution transformed at increasing dose by an acid catalyzed chemical reaction that removes a protecting group (e.g., dissolution inhibiting ester or acetal) to realize a latent base solubility moiety, thereby making the exposed regions of the resist more soluble. Negative tone resists, on the other hand, can have their developer dissolution reduced at increasing dose by action of an acid catalyzed crosslinking chemical reaction. Accordingly, such single-tone resists typically have a limit in the resolution that can be imaged thereon given in part by the resolution of the aerial image that can be produced.

Some embodiments of the invention are directed to the use of multi-tone resist compositions. In such compositions, the dissolution rate of the resist can be hindered or enhanced one or more times depending on exposure to one or more lithographic radiation doses. By enabling a change in the dissolution rate of a resist more than once as a function of the lithographic radiation dose, finer patterns having a higher resolution can be obtained. Multiple thresholds enable multiple features to be printed within a characteristic period of the intensity modulation in the resist enabling higher resolution. The multiple changes in resist solubility can be induced by any number of mechanisms such as chemical, molecular weight changes, and/or polarity-based solubility changes.

For example, for a dual-tone resist, portions of resist receiving a dose lower than the positive tone threshold level, $E_p$, and portions of resist receiving a dose higher than the negative tone threshold level, $E_n$, remain after development. Portions of the resist receiving a dose between $E_p$ and $E_n$ are soluble in developer. This produces a doubling of feature density compared to the period of the aerial image in a single layer of resist. The resist can still behave as a single tone resist by appropriately tailoring the time integrated intensity distribution to only intersect one transition level.

Figure 1B:
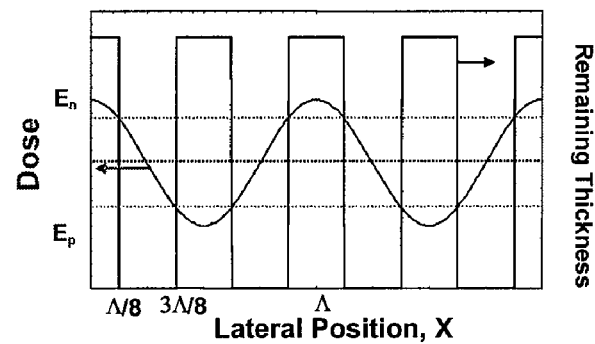
FIG. 1B is a graph of the associated time integrated intensity and remaining film thickness after development for a resist, consistent with the aerial image depicted in FIG. 1A.

FIG. 1A shows a representative sinusoidal aerial image with contrast γ. As used herein, the image contrast γ is a measure of the difference between peaks and valleys of the aerial image. FIG. 1B shows the associated time integrated intensity, or dose, and remaining film thickness after development for an exemplary dual-tone resist. For equal lines and spaces, the final half-pitch can be Λ/4 wide, where Λ is the period of the aerial image. This contrasts with the use of single tone resists where lines and/or spaces can be positioned no closer than the corresponding heights or troughs of the sinusoid.

Figure 1C:
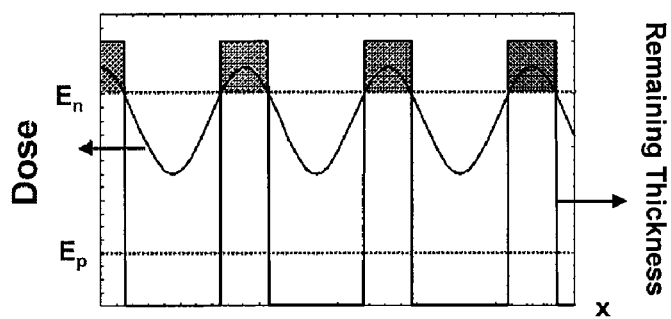
FIG. 1C is a graph of the associated time integrated intensity and remaining film thickness after development for a resist in which an oscillatory energy intensity is selected so that the lowest energy intensity is greater than the positive tone threshold level $E_p$, consistent with some embodiments of the invention.

In some embodiments, the values of $E_n$ and $E_p$ can be adapted to alter the line-to-space ratio of an aerial image contrast. For example, when the image contrast and the values of $E_n$ and $E_p$ are situated as shown in FIG. 1B, a line-to-space ratio that is double the frequency of the sinusoidal image can be achieved. In another example, DC voltage biasing can be utilized to provide an intensity offset, which when combined with $E_n$ and $E_p$ values, can change the line-to-space ratio. As depicted in FIG. 1C, the lowest energy of the sinusoidal dose pattern is greater than the positive tone threshold $E_p$. Accordingly, the pattern only utilizes a single transition; the line-to-space ratio resembles that of a single tone resist, and is half that shown in FIG. 1B. In some embodiments, a $E_n/E_p$ ratio can be adapted (e.g., tailored to have a selected value between about 1 and about 10) in conjunction with an image contrast γ of a resist to control the line-to-space ratio of an image such that the line width and space width are not necessarily equal.

As an example of two-dimensional imaging, if the aerial image is a two-dimensional array of high-intensity "peaks" surrounded by low-intensity "valleys," a dual-tone resist can enable printing pillars on a grid oriented at 45 degrees from the original array and at a frequency that is about 1.4 times higher. The relative sizes of alternating pillars can be controlled by the ratio $E_n/E_p$, as in the one-dimensional case.

In another example, a three-or-more-tone resist can enable additional spatial frequency multiplication beyond that of a dual-tone resist. For a quad-tone resist, the resist composition can exhibit two positive tone thresholds, $E_{p1}$ and $E_{p2}$, and two negative tone thresholds, $E_{n1}$ and $E_{n2}$, where the relative energy thresholds are ordered as $E_{n2}>E_{p2}>E_{n1}>E_{p1}$. Portions of the resist receiving a dose lower than the positive tone threshold level, $E_{p1}$, and portions of resist receiving dose higher than the negative tone threshold level, $E_{n2}$, remain after development. In addition, portions of resist receiving doses between $E_{n1}$ and $E_{p2}$, also remain after development. Overall, this produces a quadrupling of feature density compared to the period of the aerial image in a single layer of resist. An advantage of patterning with a multi-tone resist is that with appropriate intensity biasing, pitches can be printed both at the fundamental and at multiples of the aerial image period on the same fixed angle interference tool.

Figure 2:
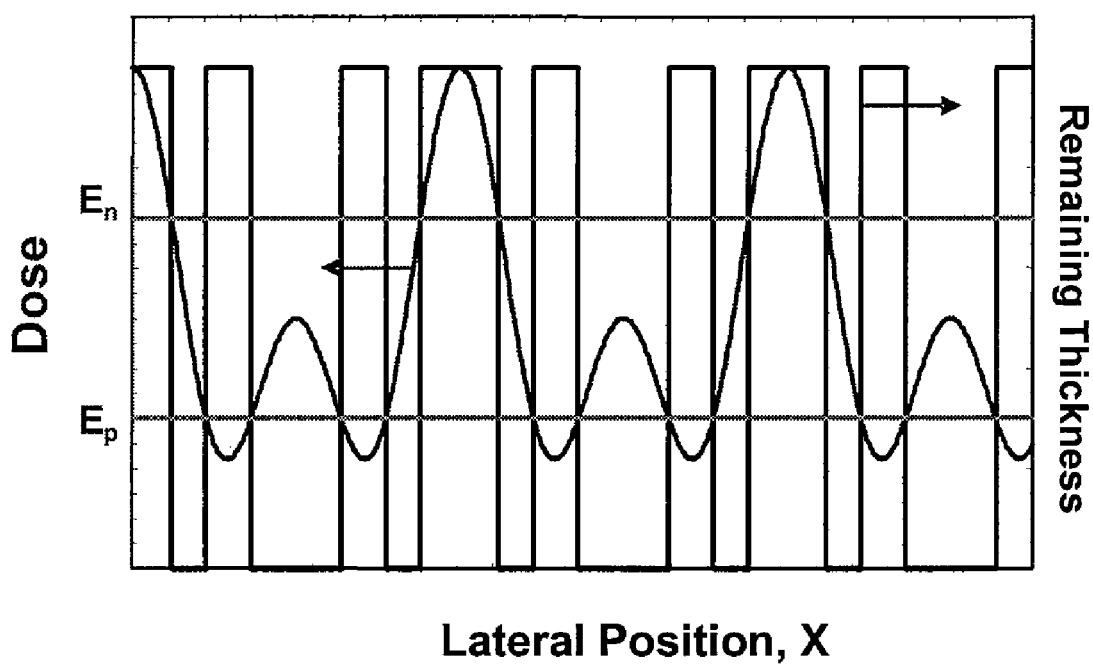
FIG. 2 is a graph of a time integrated intensity and remaining film thickness after development according to another embodiment of the invention in which the exposure is produced by summing two sinusoidal lithographic radiation patterns, one at half the frequency of the other.

Multi-tone resists, such as a dual-tone resist with controlled $E_n/E_p$, can also enable the patterning of asymmetric structures, depending on the relative magnitude of the components in the aerial image if one frequency is accompanied by one or more lower frequency components as shown in FIG. 2. FIG. 2 illustrates a representative time integrated aerial image for producing an asymmetric grating in a dual-tone resist with a contrast curve, in which the time integrated intensity, or spatial variation in dose, is produced by summing two sinusoidal intensity patterns, one at half the frequency of the other.

Accordingly, the use of multi-tone resists can provide several potential advantages over single-tone resists. By appropriate tailoring of the composition, multi-tone resists can potentially overcome deficiencies in the aerial image. Multi-tone resists can also pattern complex structures in a single exposure, i.e., not requiring multiple steps of lithographic radiation dosage but rather accomplishing imaging in a single image shot. It is understood, however, that multi exposure imaging can also be utilized with the compositions described herein.

Methods of Imaging Using Multi-Tone Resists

Some exemplary embodiments are drawn to methods for forming a pattern with a resist to perform lithography. By patterning resist materials using the methods described herein, various other processes can be applied to etch or otherwise process an underlying substrate in a manner corresponding with the resist pattern.

A multi-tone resist composition consistent with any of the compositions described by embodiments herein can be applied to a substrate such as a wafer. For example, the resist composition can comprise an acid generator, and an aliphatic polymer with acid labile groups and a crosslinkable group. The crosslinkable group can be a crosslinkable hydroxide or a latent crosslinkable hydroxide (i.e., a group capable of forming a crosslinkable hydroxide via an acid-catalyzed reaction). Application of the resist composition can be by any appropriate method, such as by spin coating or other techniques known to one skilled in the art. The term "substrate" refers to a material body having a surface typically suitable for application of a resist composition thereon. In many instances, a substrate can be a portion of an electronic device on which a layer can be deposited, and/or lithographic processes can be conducted therewith. For instance, a substrate can be a wafer (e.g., single crystal, polycrystalline, amorphous, etc.) comprising silicon, germanium, gallium arsenide, or other materials including those typically utilized in electronics manufacturing.

Optionally, a post-apply bake (herein "PAB") can be performed on the applied resist composition to help remove unwanted solvent, to help induce film formation, and/or to prepare the composition for exposure to lithographic radiation. Such a step can be performed by placing the resist-covered substrate on a hot plate or in an oven (e.g., at a temperature in a range from about 70° C. to about 160° C.). The PAB treatment can result in a resist that can have high sensitivity to lithographic radiation, can be resistant to autocatalytic decomposition, and/or can have good adhesion to a substrate. The resist can also have high transparency and/or sensitivity to a desired wavelength (e.g., below about 200 nm), and can have good thermal stability.

The multi-tone resist can be selectively exposed to multiple different dosages of lithographic radiation. Each selective dosage can interact with the resist composition in a particular manner to aid resist pattern formation, which can be revealed after the resist is contacted with a developer. For instance, particular areas of the resist exposed to lithographic radiation can be washed out with a developer. The choice of developer will depend on the type of resist, in particular on the nature of the binder employed and/or of the resultant products from lithographic radiation induced reactions. In many embodiments, the developer can comprise aqueous solutions of bases to which organic solvents or mixtures thereof can be added. An example is a solution with tetramethyl ammonium hydroxide. In some instances, a post-exposure bake (herein "PEB") can be performed after lithographic radiation exposure but before developer addition to prepare the exposed resist composition for development. Such a step can be performed by placing the resist-covered substrate on a hot plate or in an oven (e.g., at a temperature of about 70° C. to about 160° C.).

In an exemplary embodiment, a resist composition can be formulated with limited solubility (i.e., being essentially insoluble, or having very little solubility in comparison to a substantially soluble portion, such as being at least 20 times less soluble), when contacted with a developer solution. In such an instance, the limited solubility can be maintained under selective conditions, such as while an acid labile group of an aliphatic polymer maintains coupling to the polymer, and/or so long as the resist composition is exposed to less than a threshold amount of lithographic radiation. A first portion of the resist composition can be selectively exposed to a first lithographic radiation dose. The first dosage can be at a level such that the first exposed portion is substantially soluble when contacted with the developer solution. For instance, the first exposure dosage can activate removal of some or all of the acid labile groups of an aliphatic polymer of the resist composition. As well, the lithographic radiation dose can activate an acid generator portion of the resist composition to produce an acid, which can induce removal of an acid labile group. Removal of an acid-labile group can transform a protected group into a developer-susceptible group, such as an ester into a carboxylic acid, making a polymer soluble in the developer (e.g., a base developer solution). A second portion of the resist can be selectively exposed to a second lithographic radiation dosage. The second exposed portion can also have limited solubility when contacted with the developer. Such limited solubility can be due to the second lithographic radiation dosage being capable of inducing crosslinking of the aliphatic polymer, e.g., by crosslinking at one or more crosslinkable sites of the aliphatic polymer.

Typically the dosages of radiation are ordered such that the first dose provides a lower dose than the second. As well, the dosages of lithographic radiation can differ in nature but are the same in some embodiments (e.g., each of the doses are from a single lithographic radiation exposure). More portions of the resist can be exposed with intermediate, or higher or lower, doses of lithographic radiation relative to the first and/or second lithographic radiation dosage, which can result in various other levels of solubility changes when a three-tone, four-tone, or further multi-tone resist is exposed to a developer. In some embodiments, the ratio of the second lithographic radiation dosage to the first lithographic radiation dosage can be below a threshold value of about 20, or about 15, or about 10. Such embodiments can, in some instances, distinguish situations where the resist undergoes an intended crosslinking event when exposed to the second lithographic radiation dose from some other chemical change in the resist composition due to an excessive dose of lithographic radiation. In some instances, the second lithographic radiation dosage can be lower than about 400 mJ/cm$^2$.

In general, the various doses of lithographic radiation applied to the selected portions of the resist composition form an image on the resist, which can conform to the pattern desired to be formed with the resist. The terms "imaging" and "image," as applied to a resist, refer to the process and form, respectively, of a selected pattern on the resist by interaction of the resist with lithographic radiation. The selected pattern can be any desired geometrical shape, and is typically two-dimensional in character. Processes for imaging a resist include any process capable of delivering the lithographic radiation in a manner suitable for proper image formation. In some instances, the lithographic radiation is applied in a manner to expose the resist to a pattern of lithographic radiation that is similar to the selected pattern for the resist. For example, a mask can be located between the lithographic radiation source and the resist surface. The mask can have regions that preferably allow lithographic radiation penetration, inducing an radiation image on the surface of the resist. In another example, a maskless aerial image pattern is directly projected onto the resist surface, such as utilized in photolithography and/or electron beam lithography. Interference based aerial imaging systems can also be utilized, such as those employing essentially a single spatial frequency which can optionally include a DC component. In other instances, the lithographic radiation is applied by scanning the resist, by either moving the target or radiation source or both. Though the various doses of lithographic radiation can be administered in any acceptable manner (e.g., serial exposures of a region to reach a final accumulated dosage distribution), in some embodiments it is advantageous to administer such doses in a single lithographic radiation exposure for each portion receiving a selected lithographic radiation dosage.

A variety of lithographic radiation types can be used with the methods described herein. The phrase "lithographic radiation" refers to the energy medium used to impart a pattern upon a resist composition. In many instances, lithographic radiation can be embodied as electromagnetic radiation of a certain wavelength, or wavelength range, and can be further characterized by a dose (e.g., energy/area) or energy flux. Though any wavelength or wavelength range suitable for imaging a resist composition can be utilized, in some embodiments the wavelength can be in a range from about 140 nm to about 260 nm, and can include one or more wavelengths such as about 157 nm, about 193 nm, about 248 nm. Higher wavelengths, for example above 200 nm such as 248 nm and/or 365 nm, can also be used. Other electromagnetic radiation ranges include EUV and/or x-rays. Techniques used to generate such lithographic radiation types include any suitable methodology including those known to a skilled artisan (e.g., ArF excimer lasers to produce light at about 193 nm and/or molecular fluorine lasers to produce light at about 157 nm). In some embodiments, lithographic radiation can also be embodied by electron beams and ion beams, which can be generated by acceleration potential ranging from about 0.1 to about 200 KeV and from about 50 to about 500 KeV, respectively.

With regard to some embodiments, the methods can have particular potential advantages when utilized with electromagnetic radiation having at least one wavelength below about 200 nm. Non-limiting examples include wavelengths in the range from about 190 nm to about 195 nm (e.g., at about 193 nm), or in the range from about 155 nm to about 160 nm (e.g., at about 157 nm), or in the EUV range, or in the range of x-rays, or any combination thereof. In particular, tailoring a method to be used with wavelengths below 200 nm can extend the usefulness of currently known systems for performing lithography.

Embodiments of the invention can also utilize additional techniques to further improve the resolution of a pattern to be formed on a multi-tone resist composition. For example, though many embodiments herein describe the use of multi-tone resists in a "dry" lithography context, liquid immersion techniques can also be employed with a multi-tone resist. Liquid immersion lithography involves the introduction of a fluid between the last optical element and the resist surface. The effective wavelength of the imaging system is reduced in proportion to the index of refraction of the liquid. Since the performance of projection optics is essentially limited by diffraction, the shorter effective wavelength ($\lambda_{eff}=\lambda_o/n_f$ in a fluid of index $n_f$) enables a higher resolution when the vacuum wavelength $\lambda_o$ and θ, the angle of propagation between the lens and the resist, remain constant. The types of immersion fluids and equipment to perform liquid immersion lithography are known to one skilled in the art. Accordingly, such fluids and techniques can be employed with the multi-tone resist aspects discussed in the present application to potentially derived even further enhancements in imaging resolution.

Multi-Tone Resist Compositions Having Aliphatic Polymers with Acid-Labile Groups Some embodiments of the present invention are drawn to compositions, which can also or alternatively be used in methods herein, that utilize a multi-tone resist that is selected to provide variable resist dissolution in a developer upon variable lithographic radiation dosing. Though a variety of resist compositions can be utilized beyond those specifically described herein, some embodiments are directed to the use of a composition comprising an acid generator and an aliphatic polymer. The aliphatic polymer can have acid-labile groups, and can also have a plurality of crosslinkable sites. Crosslinkable groups capable of crosslinking the aliphatic polymer can be located at the crosslinkable sites of the polymer. Examples of crosslinkable groups include crosslinkable hydroxides and latent crosslinkable hydroxides. A crosslinkable hydroxide can include one or more native hydroxides in a polymer that can induce crosslinking of the polymer upon exposure to a selected level of lithographic radiation. As utilized herein, the phrase "latent crosslinkable hydroxide" refers to groups that can form a crosslinkable hydroxide via an acid-catalyzed reaction (e.g., from a photo-generated acid). The resist compositions can optionally include any number of other components such as crosslinking agents, lithographic radiation activated base generators, base additives, sensitizers, surfactants, and dyes.

In some embodiments, the resist composition can be formulated to have a low absorbance for at least one wavelength of an applied lithographic radiation. For example, the resist composition can have an absorbance of less than about 10 $\mu m^{-1}$, or 5 $\mu m^{-1}$, or 1 $\mu m^{-1}$, for at least one wavelength of light with a wavelength smaller than about 200 nm. In one embodiment, the resist composition can have an absorbance at about 193 nm and/or about 157 nm of less than about 5 $\mu m^{-1}$. In another embodiment, the resist composition can have an absorbance at about 193 nm and/or 157 nm of less than about 1 $\mu m^{-1}$.

As utilized within the present application, the term "polymer" refers to a molecule comprising repeat units. In many embodiments, the number of repeat units in the molecule is 20 or greater. Repeat units can be adjacently connected, as in a homopolymer. The units, however, can be assembled in other manners as well. For example, a plurality of different repeat units (e.g., two, three, or more) can be assembled as a copolymer. If A represents one repeat unit and B represents another repeat unit, copolymers can be represented as blocks of joined units (e.g., A-A-A-A-A . . . B-B-B-B-B . . . ) or interstitially spaced units (e.g., A-B-A-B-A-B . . . or A-A-B-A-A-B-A-A-B . . . ), or randomly arranged units. In general, polymers include homopolymers, copolymers (e.g., block, inter-repeating, or random), cross-linked polymers, linear, branched, and/or gel networks, as well as polymer solutions and melts.

The phrase "aliphatic polymer" refers to a polymer that does not include one or more aromatic rings in its structure. Accordingly, aliphatic polymers can be copolymers, can have a number of multiple bonds, and/or can be substituted with non-hydrocarbon portions. Aliphatic polymers can also be configured in a variety of structural manners such as straight chained, branched, and/or with one or more ringed structures. Aliphatic polymers can be potentially advantageous with used in some resist compositions owing to their low absorbance for particular wavelengths of electromagnetic radiation (e.g., below about 200 nm).

Any number of aliphatic polymers can be used so long as their presence is consistent with embodiments of the invention described herein. In some embodiments, the aliphatic polymers comprise an acrylate portion, such as a methacrylate portion (e.g., the polymer has a plurality of methacrylate repeat units). Acrylate polymer portions can advantageously exhibit low absorbance at wavelengths below about 200 nm (e.g., at about 193 nm). In general, a portion of a polymer can be a part of a polymer embodied as repeating units in a block or ordered or unordered manner. Various types of acrylate and/or methacrylate repeat units can be utilized in a polymer.

Figure 3:
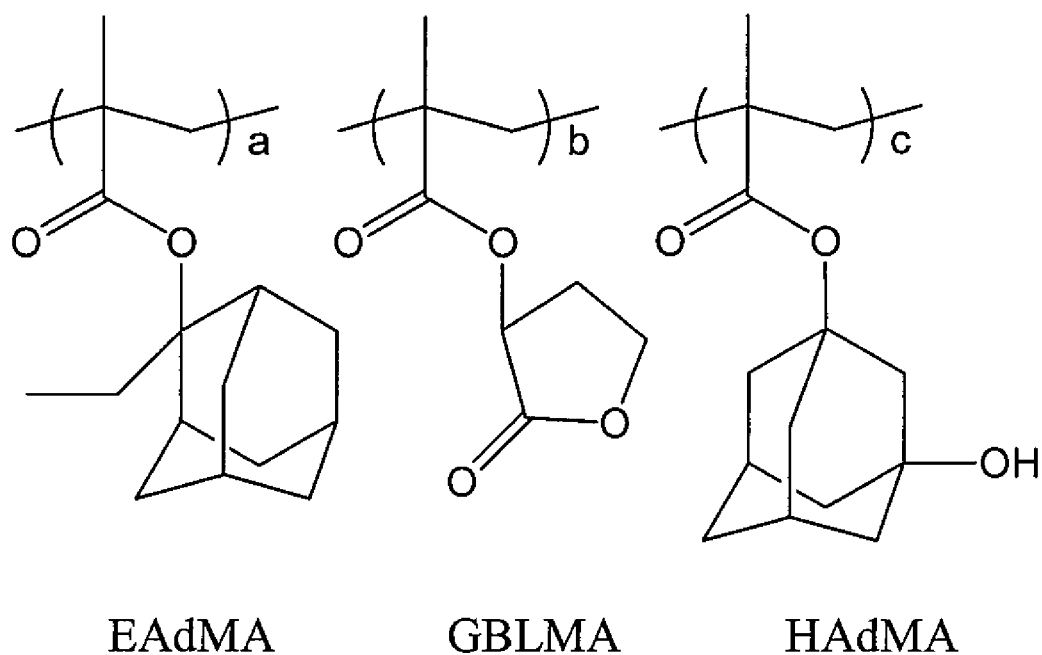
FIG. 3 depicts the repeat units of a terpolymer that can be utilized in a resist composition, consistent with some embodiments of the present invention.

One example of an aliphatic polymer is a terpolymer having three types of methacrylate repeat units shown in FIG. 3 corresponding with poly(ethyladamantyl methacrylate) (EAdMA), poly γ-butyrolactone methacrylate (GBLMA), and polyhydroxyladamantyl methacrylate (HAdMA). The subscripts a, b, and c denote the relative amounts of the groups, which can be selected to tailor the properties of the polymer. The adamantyl groups can act as the acid-labile groups of the polymer. The hydroxyadamantyl group on the HAdMA can provide crosslinkable hydroxide groups of the polymer, and the lactone of the γ-butyrolactone can provide a latent crosslinkable hydroxide.

When exposed to sufficiently low pH conditions (e.g., from activation of an acid generator), the adamantyl groups of the polymer of FIG. 3 can be removed to leave a carboxylic acid, which can lead to polymer solubility in base developers. After sufficiently high lithographic radiation dosages, however, the hydroxyl groups of the HAdMA portion can transesterify with the EAdMA portion, in either ester or carboxylic acid form, or the GBLMA portion, to crosslink the polymer and limit its solubility. Alternatively, the lactone of the GBLMA can also act to crosslink with another latent crosslinkable hydroxide group, such as another lactone of a GBLMA group, when a sufficient dosage of lithographic radiation is applied. Crosslinking agents can also be utilized to react with the HAdMA's hydroxyl group, or at the site of a latent crosslinkable hydroxide group (e.g., when the group forms a suitable hydroxide), to cause the resist composition to have limited solubility in the developer. It is understood that aliphatic polymers consistent with embodiments herein can utilize any of the polymer portions of this terpolymer with other repeat units, or that the units of the described terpolymer can be combined with other repeat units, or that individual polymers having portions of the terpolymer can also be used.

Figure 4A:
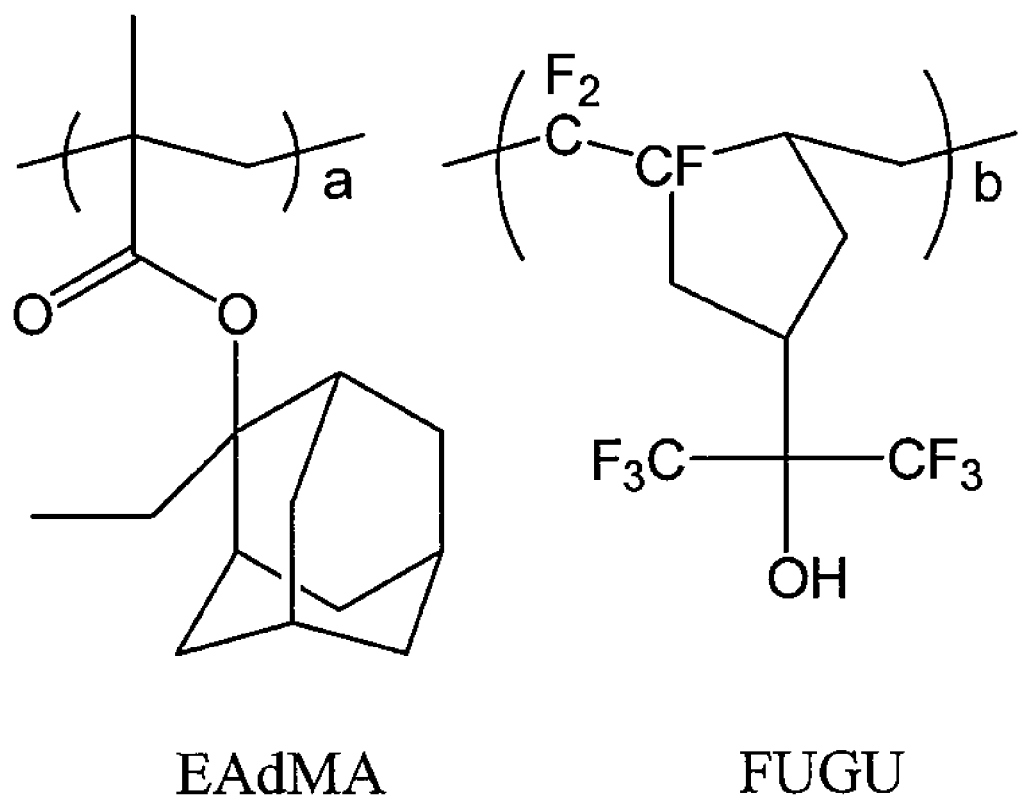
FIG. 4A depicts the repeat units of a copolymer that includes EAdMA repeat units and FUGU repeat units, consistent with some embodiments of the present invention.
Figure 4B:
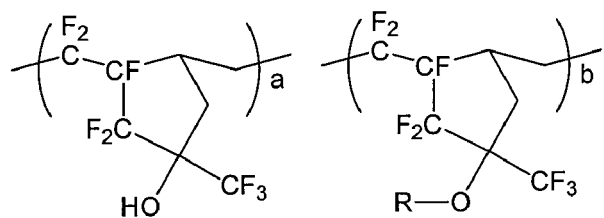
FIG. 4B depicts the repeat units of a copolymer that includes FUGU repeat units having five-membered rings, consistent with some embodiments of the present invention.
Figure 4B:
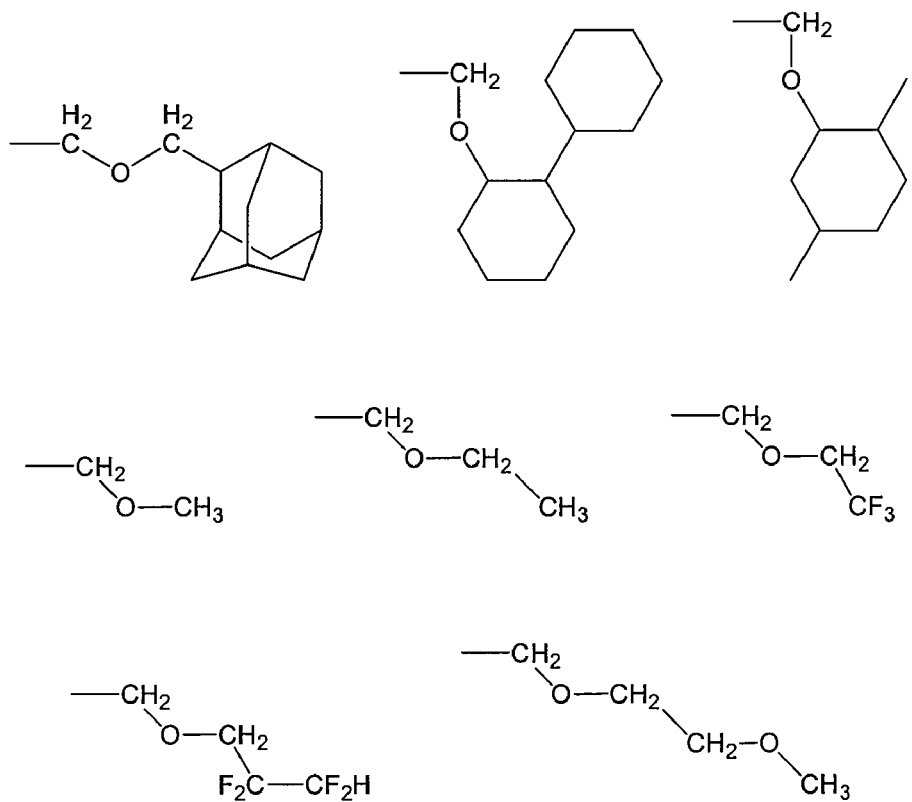
Figure 4C:
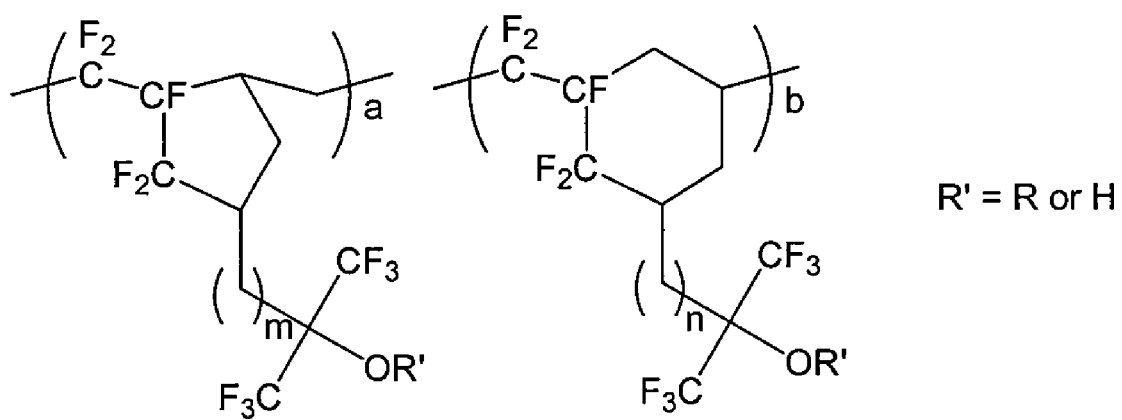
FIG. 4C depicts the repeat units of a copolymer that includes FUGU repeat units having five and six membered rings, consistent with some embodiments of the present invention.
Figure 4D:
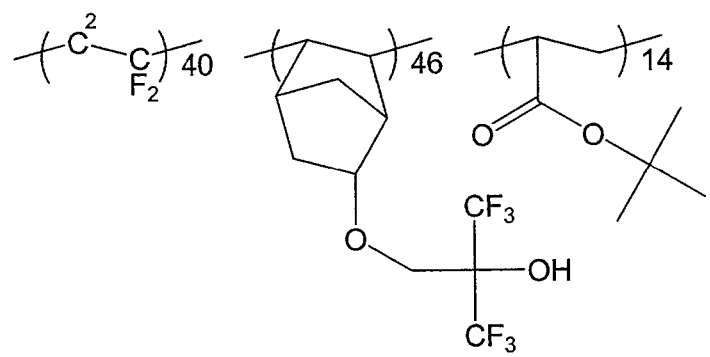
FIG. 4D depicts the repeat units of an exemplary fluoroacrylate polymer, consistent with some embodiments of the present invention.
Figure 4E:
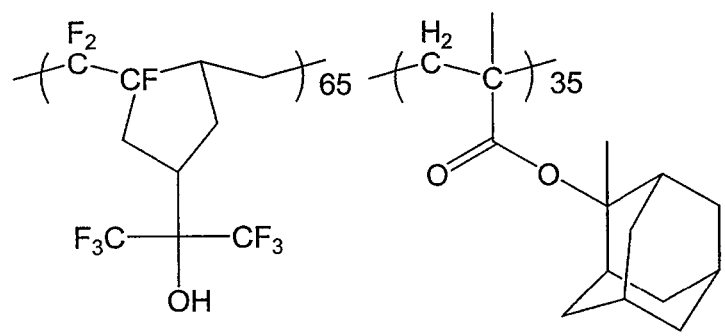
FIG. 4E depicts the repeat units of another exemplary fluoroacrylate polymer, consistent with some embodiments of the present invention.
Figure 4F:
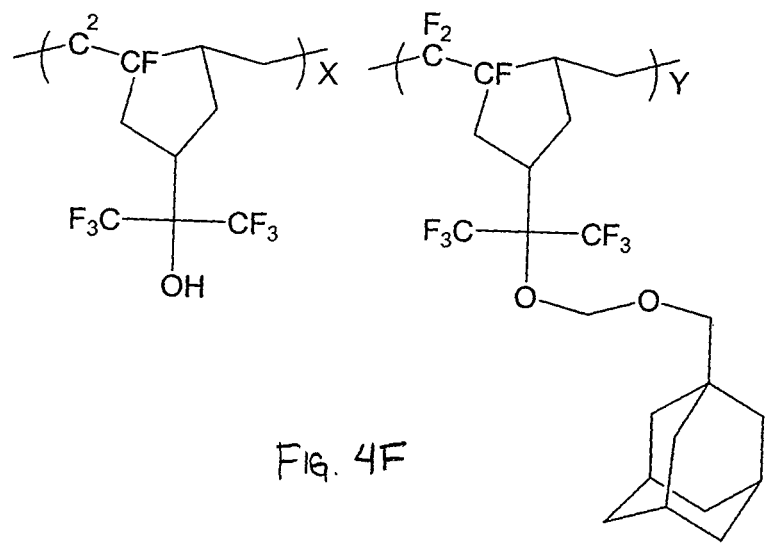
FIG. 4F depicts repeat units of an exemplary fluoropolymer, consistent with some embodiments of the present invention.

In some embodiments, the aliphatic polymers comprise an fluoroaliphatic portion. Such polymers can be especially effective at wavelengths below about 200 nm (e.g., such as about 193 nm and/or 157 nm) because of their low absorbance of the light. Examples of fluoroaliphatic polymers include polyethylene substituted with any amount of fluorine, and/or fluoroalcohol portions, the latter portion acting as a source of crosslinkable hydroxide. Fluoroaliphatic polymers can also include one or more latent crosslinkable hydroxide groups. Other embodiments can utilize fluoroacrylate polymers, or copolymers with various types of acrylate and fluoroaliphatic repeat units. Examples of fluoroaliphatic repeat units are shown in FIG. 4A, corresponding with one particular copolymer of EAdMA and a monocyclic fluoropolymer unit (FUGU). The adamantyl group can act as a acid labile group, as described herein. The hydroxide group of the FUGU can act to help crosslink the polymer via transesterification, or reaction with a crosslinking agent. FIG. 4B shows another potential copolymer's repeat units, where the R group acts as an acid labile group (e.g., a protecting group). It is noted that the ring of a FUGU unit can be five or six-membered, the latter being depicted by the copolymer represented in FIG. 4C, where m and n can range from 1 to 10, for example. The FUGU members can also have varying degrees of fluorination to tailor properties such as absorbance of a light wavelength such as about 157 nm and/or about 193 nm. Examples of fluoroacrylate polymers and other types of fluoroaliphatic polymers are shown in FIGS. 4D & 4E and 4F, respectively. In some embodiments, a fluoropolymer can include an ester structure, such as depicted in FIGS. 4B, 4C, and 4F, which can aid in transesterification. As mentioned earlier, crosslinking agents can be incorporated with a fluoroaliphatic polymer to induce crosslinking of the polymer's hydroxyl groups. In such instances, the fluoroaliphatic polymer need not incorporate a portion having an ester structure.

As alluded to above, aliphatic polymers can be copolymers that include portions that are acrylates (e.g., polymethacrylates) and portions that are fluoroaliphatic as well. Other arrangements, however, can also be utilized. Though some embodiments utilize aliphatic polymers as copolymers, aliphatic polymers can also comprise a mixture of distinct separate polymer molecules. Such molecules can be a mixture of homopolymers (e.g., a mixture of acrylates and/or fluoroaliphatics consistent with the portions described herein), or a mixture of copolymers, or a mixture of both types of polymers. Such mixtures are all within the scope of the present invention so long as the mixture conforms with the desired characteristics of multi-tone resist composition described herein.

Acid labile groups of an aliphatic polymer can act to hinder solubilization of the polymer. An interaction between the lithographic radiation, e.g., 193 nm or 157 nm radiation, and an acid generator in the resist composition results in the release of acid, which facilitates selective cleavage of acid labile groups, e.g., protecting groups from particular sites on a molecule. As a consequence, the resultant unprotected groups are susceptible to solubilization under basic conditions, i.e., the regions of the resist material that are exposed to sufficient lithographic radiation dosages (e.g., a second dose as described above) are rendered alkali soluble, whereas the unexposed regions (e.g., portions still having attached protecting groups) of the resist material remain alkali insoluble. One skilled in the art will appreciate that the choice of a protecting group(s) can be tailored to the specific application and conditions to which the protected group must withstand.

Acid labile groups can include groups bearing protected functionalities, which can be labile in the presence of in-situ generated acid (e.g., from acid derived from an acid generator). The term "protected group" is well recognized in the art and is intended to include those groups that are resistant to basic solutions but are removed under acidic conditions. In many embodiments, the acid labile groups are removable under the mild acidic conditions produced by an activated acid generator. The acid labile groups can render reactive groups substantially inert to particular reaction conditions as noted, for example, in Protective Groups in Organic Synthesis, 2 ed., T. W. Green and P. G. Wuts, John Wiley & Sons, New York, N.Y. 1991, which is incorporated herein by reference for all purposes.

Examples of acid labile groups, which can be utilized to protect functional groups, include: acetals, ketals, esters (including carbonates), e.g., t-butyl esters, and ethers known in the art; trialkyl silyl groups, such as trimethylsilyl and t-butyldimethylsilyl (TBDMS); and groups such as trityl, tetrahydropyranyl, vinyloxycarbonyl, o-nitrophenylsulfonyl, diphenylphosphinyl, p-toluenesulfonyl, and benzyl, can all be utilized. Additionally, $CH_3OCH_2Cl$, $(CH_3)_3SiCH_2CH_2OCH_2Cl$, $CH_3OCH_2CH_2OCH_2Cl$, $ClCO_2$-t-butyl, methyl dihydropyran, methyl dihydrofuran, tetrabutylvinylether, 2-methoxypropene, isobutylvinylether and ethylvinylether are useful as protecting groups as noted, for example, in C. Mertesdor et al. Microelectronics Technology, 1995, pg. 35-55 which is incorporated herein by reference for all purposes.

In some embodiments, small molecules, which can help to inhibit hydrolysis of an acid labile protection group, can be included in the resist composition. Examples of small molecules are ester, ether, ketal or acetal protected low molecular weight polyhydridic alcohols, low molecular weight alcohols, and combinations thereof. Suitable low molecular weight hydrolysis inhibitors include, for example, Di-Boc Bisphenol A, Di-Boc ocresolphthalein, tert-butyl lithocholate and tert-butyl deoxycholate (available from Midori Kagaku Co., Ltd. Tokyo, Japan).

Other embodiments can utilize small molecules having hydroxyl groups to assist in crosslinking of an aliphatic polymer. Such molecules can act to assist transesterification of the polymer between crosslinkable portions, and/or can act with a crosslinking agent to further facilitate crosslinking of aliphatic polymer molecules. Examples of such molecules include low molecular weight polyhydridic alcohols, low molecular weight alcohols, low molecular weight diols, and combinations thereof.

In many embodiments, aliphatic polymers can include crosslinkable groups which can crosslink the polymer. This preferably occurs at a threshold dosage of lithographic radiation, e.g., corresponding with the second dosage of lithographic radiation mentioned earlier. Thus, after the portion of the resist is subjected to the elevated radiation level, a polymer, which can have become soluble if subjected to a base developer because of earlier removal of the acid labile group, becomes crosslinked, and thus has limited solubility in the developer due to the effective growth in the polymer's molecular weight.

Though crosslinkable groups can include any number of functional groups, some embodiments are directed to crosslinkable groups that comprise, or essentially exclusively include, at least one of a crosslinkable hydroxide group and a latent crosslinkable hydroxide. Crosslinkable hydroxide groups can be exemplified in a number of variations such as alcohol groups in a polymer. Crosslinkable hydroxide groups are generally defined to exclude hydroxides that are directly linked to a carbonyl group (e.g., forming a carboxylic acid). Latent crosslinkable hydroxides capable of forming crosslinkable hydroxides can include carbonyl groups susceptible to attack by an acid to form the crosslinkable hydroxide (e.g., a lactone, an acetal, and/or an ester). In many embodiments, either a crosslinkable hydroxide group or a latent crosslinkable hydroxide group capable of transformation into a hydroxide group can be activated by a selected dosage of lithographic radiation to induce crosslinking. Accordingly, the presence of such group(s) can crosslink a resist composition, making the composition insoluble after it was previously rendered soluble such as to impart the multi-tone character of the composition.

Crosslinking of the crosslinkable group can occur using a number of different mechanisms. In one mechanism, the crosslinkable group, e.g., a crosslinkable hydroxide group and/or a latent crosslinkable hydroxide group, can undergo a transesterification reaction with another portion of the polymer to induce crosslinking. The site of a crosslinkable group, for example, can react with a carboxylic acid group formed from the removal of an acid labile group. Alternatively, the crosslinkable group can react with an ester group, such as an acid labile group that has not been removed from the polymer, or some other ester group in the polymer.

In another mechanism, crosslinking can be facilitated by the use of a crosslinking agent present in the resist composition. Such an agent reacts with an appropriate hydroxyl group, and can be used to link the polymer with another polymer. Appropriate hydroxyl groups include latent crosslinkable hydroxide groups having formed a suitable hydroxyl group at the polymer crosslinkable site for crosslinking (e.g., by activation via the acid generator). The amount of crosslinker added to the resist composition can be controlled to induce sufficient crosslinking upon availability of hydroxide groups after an acid labile group is removed sufficiently from the polymer.

Any type of crosslinking agent suitable for reacting with a hydroxyl group, and compatible with the uses of the resist composition, can be employed. One example of a crosslinking agent is the use of an amino-formaldehyde resin; such agents are described in the reference, W. J. Roff, J. R. Scott, and J. Pacitti, *Handbook of Common Polymers*, CRC Press (1971) Section 27, pages 285-298, which is hereby incorporated by reference herein. Other examples of crosslinking agents include alkoxymethylmelamine, methylomelamine, alkoxymethylglycoluril, methyloglycoluril, alkoxymethylbenzoguanamine, methyloguanamine, methylourea, and alkoxymethylurea. In addition, crosslinking agents can be mixtures of the alkoxymethyl- and methylo-types, such that alkoxymethyl-methylomelamine, alkoxymethyl-methyloglycoluril, alkoxymethyl-methyloguanamine, and alkoxymethyl-methylourea are all possible agents. As well, mixed alkoxy types, such as methoxy, ethoxy, butoxy etc, can also be utilized.

Some specific examples of crosslinking agents include highly methylated melamine-formaldehyde resins such as hexamethoxymethylmelamine or methoxymethylmelamine; partially methylolated and highly methylated melamine-formaldehyde resins such as pentamethoxymethylmelamine, tetramethoxymethylmelamine, and trimethoxymethylmelamine; highly methylolated and partially methylated melamine-formaldehyde resins such as methoxymethylmethylolmelamine; alkoxymethylmethylolmelamine or buthoxyethoxymethylmethylolmelamines; glycoluril-formaldehyde resins such as tetrabuthoxymethyglycoluril, ethoxymethoxymethyglycoluril, tetramethyloglycoluril; tetramethoxymethyglycoluri; and urea-formaldehyde resins such as tetramethoxymethylurea, tetrabutoxymethylurea. Commercial manufacturers of these crosslinking agents include Cytec Industries, Inc., West Paterson, N.J., and INEOS Melamines, Marietta, Ga.

The term "acid-generator" refers to one or more compounds, which can generate an acid when exposed to a selected lithographic radiation. For example, an acid generator for use in a composition can respond to one or more wavelengths or energies such as 248 nm, 193 nm, 157 nm, EUV, x-rays, e-beam (high or low voltage e-beam), and/or ion beam. The acid generator should also be soluble in the resist composition or in an organic solvent. Preferably, a solution of the acid-generator along with the other components of a resist composition are suitable for spin coating.

Examples of suitable acid generators include onium salts, such as di phenyliodonium salts, triphenylsulfonium salts, sulfonium salts, iodonium salts, diazonium salts and ammonium salts, nitrobenzyl esters such as 2,6-nitrobenzylesters, hydroxamic acid esters, phloroglucinol sulfonates, diazosulfonates, 1, 2, 3-tri(methanesulfonyloxy)benzene, sulfosuccinimides and photosensitive organic halogen compounds as disclosed in Japanese Examined Patent Publication No. 23574/1979.

Examples of diphenyliodonium salts include diphenyliodonium triflate (DPI-105, Midori Kagaku Co. Ltd.) and diphenyliodonium tosylate (DPI-201, Midori Kagaku Co. Ltd.). Examples of suitable bis(4-tert-butylphenyl)iodonium salts include bis(4-tert-butylphenyl)iodonium triflate (BBI-105, Midori Kagaku Co. Ltd.), bis(4-tert-butylphenyl)iodonium camphorsulfate (BBI-106, Midori Kagaku Co. Ltd.), bis(4-tert-butylphenyl)iodonium perfluorbutylate (BBI-109, Midori Kagaku Co. Ltd.) and bis(4-tert-butylphenyl)iodonium tosylate (BBI-201, Midori Kagaku Co. Ltd.). Suitable examples of triphenylsulfonium salts include triphenylsulfonium hexafluorophosphite (TPS-102, Midori Kagaku Co. Ltd.), triphenylsulfonium triflate (TPS-105, Midori Kagaku Co. Ltd.) and triphenylsulfonium perfluorobutylate (TPS-109, Midori Kagaku Co. Ltd.).

Specific examples of lithographic radiation sensitive organic halogen compounds include halogen-substituted paraffinic hydrocarbons such as carbon tetrabromide, iodoform, 1,2,3,4-tetrabromobutane and 1,1,2,2-tetrabromoethane; halogen-substituted cycloparaffinic hydrocarbons such as hexabromocyclohexane, hexachlorocyclohexane and hexabromocyclododecane; halogen-containing triazines such as tris(trichloromethyl)-s-triazine, tris(tribromomethyl)-s-triazine, tris(dibromomethyl)-s-triazine, perhalomethyl triazines, and 2,4-bis(tribromomethyl)-6-methoxyphenyl-s-triazine; halogen-containing benzenes such as (bis (trichloromethyl)benzene and bis(tribromomethyl)benzene; halogen-containing sulfone compounds such as tribromomethylphenylsulfone, trichloromethylphenylsulfone and 2,3-dibromosulforane; and halogen-substituted isocyanurates such as tris(2,3-dibromopropyl)isocyanurate. Among such sensitive organic halogen compounds, a bromine-containing compound, such as bromobisphenol A, can also be utilized.

Some embodiments include the use of a base generator along with the acid generator to moderate acid production in a resist composition. If only an acid generator is present, acid can continually form during exposure until the acid generator is completely consumed or the exposure ends. However, if an appropriately tailored base generator is also included, the total acid concentration can be modulated as a function of dose to produce multi-tone behavior. The resist dissolution characteristics can be controlled by the acid concentration generated during lithographic radiation exposure, in that the use of acid and base generators can create an inflection point in acid concentration as a function of dose.

One or more inflection points can be generated by controlling the concentration of the photo-generated acid and base. The concentration can be controlled by the rate of acid or base generation and the initial concentration of acid and/or base generator. Any combination of acid or base generation efficiencies and initial concentrations can be possible so long as a medium exposure will generate sufficient acid to react with the acid labile group of a polymer in the resist. At some low exposure dose, no resist film will be removed due to insufficient acid formed to catalyze sufficient removal of acid labile groups from the polymer to lead to resist development. At some medium exposure dose, the acid generated will exceed the base generated such that removal of the acid labile groups will proceed leading to removal of the resist film in developer. Finally, at some high exposure dose the level of the base will be such to effectively neutralize the acid formed and again lead to no film loss during the development process due to an insufficient level of polymer deprotection.

In one embodiment, a resists can include one or multiple acid generators and one or multiple base generators at prescribed concentrations, said generators having decomposition rates in a ratio of 1 to 1000 when exposed to lithographic radiation. In another embodiment, the acid and base generators can have decomposition rates in a ratio 1 to 100 when exposed to lithographic radiation. In yet another embodiment, the acid and base generators can have decomposition rates in a ratio 1 to 10 when exposed to lithographic radiation. The starting concentration of either the acid generators or the base generators is not limited and can vary in any ratio. For example if equal amounts of acid and base generator are added, but the base generator decomposition rate is lower than the acid generator decomposition, more acid will initially form. However, as the exposure dose is increased and acid generator is consumed, the more slowly accumulating base from the decomposition of base generator will eventually neutralize the acid produced, creating an inflection point in net acid concentration as a function of dose.

In some embodiments, a base additive can be added to the resist composition to moderate acid levels in the resist. Possible base additives suitable for use can be chosen from those that are known in the art, such as primary, secondary, tertiary and quaternary amines. Suitable organic bases include, but are not limited to, tetramethylammonium hydroxide, tetrabutylammonium hydroxide, tetraethanol ammonium hydroxide, 1,4-diazabicylo[2.2.2]octane, 1,5-diazabicyclo[4.3.0]non-5-ene, diazabicyclo[5.4.0]undec-7-ene, triphenyl amine, diphenyl amine, trioctyl amine, triheptyl amine, hexamethylenetetramine, hexamethylenetriethylenetetramine, N-diethyl-N'methylenediamine, 4-aminophenol, and 2-(4-aminophenyl)-2-(4-hydroxyphenyl) propane.

Embodiments utilizing resist composition can be dissolved in a solvent for subsequent coating on a substrate. Any suitable solvent can be utilized so long as it is capable of presenting adequate solubility to the resin and additional components, e.g., base and acid generator, and it can provide good coating properties. For example, the solvent can be a cellosolve type solvent such as methyl cellosolve, ethyl cellosolve, methyl cellosolve acetate or ethyl cellosolve acetate. Ethylene glycol based solvents such as ethylene glycol monomethyl ether, diethylene glycol monomethyl ether, diethylene glycol dibutyl ether, diethylene glycol and diethylene glycol dimethyl ether are also suitable as organic solvents for resist compositions. Further, propylene glycol based solvents such as propylene glycol monoethyl ether, propylene glycol monobutyl ether, propylene glycol monomethyl ether acetate, dipropylene glycol dimethyl ether or propylene glycol monoethyl ether acetate can be used. Suitable ester type solvents include butyl acetate, amyl acetate, ethyl butyrate, butyl butyrate, diethyl oxalate, ethyl pyruvate, ethyl-2-hydroxybutyrate, 2-methylacetoacetate, methyl lactate or ethyl lactate. Alternatively, alcohols are utilized and include heptanol, hexanol, nonanol, diacetone alcohol or furfuryl alcohol. Examples of suitable ketone solvents include cyclohexanone or methylamyl ketone. Ethers useful as solvating agents include methyl phenyl ether or diethylene glycol dimethyl ether. Polar solvents, such as dimethylformamide or N-methylpyrrolidone can also be used. A solvent can be used alone or as combinations of two or more solvents. The solvent is typically used in an amount of from 1 to 100 times by weight relative to the total amount of the solid content of the resist composition.

Further, the resist compositions consistent with embodiments of the present invention can contain various additives such as a surfactant, a coating property-improving agent, a stabilizer, a colorant and an ultraviolet absorber, to such an extent as not to impair the desired properties.

Suitable surfactants which can be added to a resist composition to improve its coating ability include, for example, nonionic surfactants. Such nonionic surfactants can include polyoxyethylene alkyl ethers such as polyoxyethylene lauryl ether, polyoxyethylene stearyl ether and polyoxyethylene oleyl ether, polyoxyethylene alkylphenyl ethers such as polyoxyethylene octylphenyl ether and polyoxyethylene nonylphenyl ethers. Further, suitable nonionic ester surfactants include polyethylene glycol dialkyl esters, such as polyethylene glycol dilaurate and polyethylene glycol distearate. Alternatively, fluorine-containing surfactants can be utilized which contain a fluoroalkyl or perfluoroalkyl group such as Efftop EF301, EF303 and EF352 (manufactured by Shinakitakasei Co., Ltd., Japan), Megafac F171, F172 and F173 (manufactured by Dainippon Ink Co., Ltd., Tokyo, Japan), Asahiguard AG710 (manufactured by Asahi Glass Co., Ltd., Japan), Florade FC430 and FC431 (manufactured by Sumitomo 3M Co., Ltd., Japan), and Surflone S-382, SC101, SC102, SC103, SC104, SC105 and SC106 (manufactured by Asahi Glass Co., Ltd., Japan). Organosiloxane surfactants, such as organosiloxane polymer KP341 (manufactured by Shinetsu Kagaku Kogyo Co., Ltd., Japan) are also suitable for decreasing the surface tension of the solution containing the photosensitive composition. Additionally, acrylic acid- or methacrylic acid-type polymers and copolymers such as Polyflow No. 75, No. 95 and WS (manufactured by Kyoeisha Yushikagaku Kogyo Co., Ltd., Japan); and the like are also suitable surfactants. The surfactant can be added to in an amount of less than about 2 parts by weight per 100 parts per weight of the coating composition. In one embodiment, surfactant can be added in an amount of about 0.005 to about 1 part by weight per 100 parts by weight.

Furthermore, antioxidants or defoaming agents can be included in a composition as desired to attenuate the radiation-sensitive resist composition.

EXAMPLES

The following examples are provided to illustrate some embodiments of the invention. The examples are not intended to limit the scope of any particular embodiment(s) utilized. For example, some of the resist compositions can also be used at other electromagnetic wavelengths, other lithographic radiation types, or other types of process conditions (e.g., performing lithography either dry or in a liquid immersion environment).

Experimental Conditions

General Lithography Process Conditions

Post apply baking (PAB) was performed by placing the silicon wafer on a hot plate at the desired time and temperature. Post exposure baking (PEB) was performed by placing the silicon wafer on a hot plate for the desired time and temperature. Development was performed with aqueous tetramethylammonium based commercial resist developers. Lithographic radiation exposure was performed at about 193-nm with a laboratory-class projection system employing an $Ar/F_2$ laser.

The clearing dose ($E_0$) is the lowest exposure dose required to remove all resist after development. This metric (as opposed to, for example, 50% film removal) is used here to represent the positive tone transition. $E_0$ was determined by either fitting a line through all points containing less then 80% normalized film thickness as a function of dose, and determining the intercept for zero remaining film thickness. If no slope could be determined, $E_0$ is assigned the value of the lowest exposure dose for which no resist remained. The contrast ($\gamma$) was determined by fitting a line through all points containing less then 80% normalized film thickness as a function of the log of dose and determining the absolute value of the slope. The unexposed film thickness loss (UFTL) was determined by subtracting the film thickness of an unexposed portion of the resist after development from the film thickness of the resist prior to exposure.

The negative dose ($E_{n50}$), representing the negative tone transition, is the lowest exposure dose required to retain 50% of the initial resist thickness after development. $E_{n50}$ was determined by fitting a line through all points containing less then 80% normalized film thickness as a function of dose and determining the intercept for 50% normalized remaining film thickness. The contrast ($\gamma$) for the negative tone transition was determined by fitting a line through all points containing less then 80% normalized film thickness as a function of the log of dose and determining the absolute value of the slope.

Example 1

Preparation of Resists

Resists were prepared by combining the materials listed in Table 1, rolling the solution overnight and filtering to 0.2 micrometers. All resists contained 2250 parts by weight of cyclohexanone as the resist solvent. The polymer employed is poly(ethyladamantyl methacrylate-co-γ-butyrolactone methacrylate-co-hydroxyladamantyl methacrylate) in a 23:58:19 monomer ratio (Poly-A2). The PAG is either di-(t-butylphenyl)iodonium nonafluoro-1-butanesulfonate (TBPI-PFBS) or triphenylsulfonium nonafluoro-1-butanesulfonate (TPS-PFBS) and the base is tetrabutylammonium hydroxide.

TABLE 1

Components of resist formulation as parts by weight.

| Resist | Polymer | Polymer (parts) | PAG (type) | PAG (parts) | Base (parts) |
|---|---|---|---|---|---|
| 25011 | Poly-A2 | 240 | TBPI-PFBS | 10 | 1 |
| 25012 | Poly-A2 | 230 | TBPI-PFBS | 20 | 1 |
| 25013 | Poly-A2 | 240 | TPS-PFBS | 10 | 1 |
| 25014 | Poly-A2 | 230 | TPS-PFBS | 20 | 1 |

The resist compositions were coated onto fused silica substrates at designated thicknesses for testing.

Example 2

Resist Performance with a 0.26 N Developer

Resists 25011, 25012, 25013, and 25014 were coated to about 300 nm, PAB baked at 140° C. for 60 s, exposed at 193-nm, PEB baked at either 130 or 150° C. for 60 s, and developed for 40 s with LLD-26W (2.38% tetramethyl ammonium hydroxide, Shipley Co., Marlborough, Mass.). Results are given in Table 2.

TABLE 2

Lithographic performance of dual tone resists.

| Resist | PEB temp. (C.) | $E_0$ (mJ/cm²) | Positive γ | $E_{n50}$ (mJ/cm²) | Negative γ |
|---|---|---|---|---|---|
| 25011 | 130 | 26.7 | 7.9 | >400 | NA |
| 25011 | 150 | 26.1 | 7.4 | >400 | NA |
| 25012 | 130 | 4.3 | 8.1 | >400 | NA |
| 25012 | 150 | 4.2 | 6.9 | 13.9 | 19.0 |
| 25013 | 130 | 8.0 | 9.0 | >400 | NA |
| 25013 | 150 | 8.2 | 5.6 | >400 | NA |
| 25014 | 130 | 4.5 | 5.7 | >400 | NA |
| 25014 | 150 | 4.5 | 4.9 | 14.7 | 33.9 |

The results show that a dual tone resist can be prepared and that the resist shows negative behavior with high levels of PAG and higher PEB temperatures. The resist sensitivity for both positive and negative behavior is sufficiently high to allow high throughput manufacturing of integrated circuits. The results also show that the resist has sufficient contrast in both the positive and negative tone to expect high resolution imaging.

Example 3

Resist Performance with a 0.13 N Developer

Resists 25011, 25012, 25013, and 25014 were coated to about 300 nm, PAB baked at 140° C. for 60 s, exposed at 193-nm, PEB baked at either 130 or 150° C. for 60 s, and developed for 40 s with a 1:1 mixture of DI water:LLD-26W. Results are given in Table 3.

TABLE 3

Lithographic performance of dual tone resists.

| Resist | PEB temp. (C.) | $E_0$ (mJ/cm$^2$) | Positive γ | $E_{n50}$ (mJ/cm$^2$) | Negative γ |
|---|---|---|---|---|---|
| 25011 | 130 | 22.3 | 18.4 | >400 | NA |
| 25011 | 150 | 20.4 | 28.3 | >400 | NA |
| 25012 | 130 | 5.0 | 8.7 | >400 | NA |
| 25012 | 150 | 5.7 | 5.1 | 13.7 | 17.1 |
| 25013 | 130 | 7.9 | 6.9 | >400 | NA |
| 25013 | 150 | 8.7 | 8.9 | 19.2 | 53.4 |
| 25014 | 130 | 4.7 | 5.1 | >400 | NA |
| 25014 | 150 | 5.2 | 4.8 | 9.2 | 6.3 |

The results show that a dual tone resist can be prepared and that the resist shows negative behavior with higher PEB temperatures. The resist sensitivity for both positive and negative behavior is sufficiently high to allow high throughput manufacturing of integrated circuits. The results also show that the resist has sufficient contrast in both the positive and negative tone to expect high resolution imaging.

Example 4

Preparation of Resists

Resists were prepared by combining the materials listed in Table 4, rolling the solution overnight and filtering to 0.2 micrometers. All resists contained 2250 parts by weight of cyclohexanone as the resist solvent. The polymer employed is poly(ethyladamantyl methacrylate-co-γ-butyrolactone methacrylate-co-hydroxyladamantyl methacrylate) in a 31:52:19 monomer ratio (Poly-A3). The PAG is either triphenylsulfonium nonafluoro-1-butanesulfonate (TPS-PFBS) or triphenylsulfonium trifluoromethanesulfonate (TBPI-Tf) and the base is tetrabutylammonium hydroxide.

TABLE 4

Components of resist formulation as parts by weight.

| Resist | Polymer | Polymer (parts) | PAG (type) | PAG (parts) | Base (parts) |
|---|---|---|---|---|---|
| 25217 | Poly-A3 | 240 | TPS-PFBS | 10 | 1 |
| 25218 | Poly-A3 | 230 | TPS-PFBS | 20 | 1 |
| 25219 | Poly-A3 | 240 | TPS-Tf | 10 | 1 |
| 25220 | Poly-A3 | 230 | TPS-Tf | 20 | 1 |

Example 5

Resist Performance with a 0.14 N Developer

Resist 25217, 25218, 25219, and 25220 were coated to about 300 nm, PAB baked at 140° C. for 60 s, exposed at 193-nm, PEB baked at 140° C. for 60 s, and developed for 120 s with CD14 (1.28% tetramethyl ammonium hydroxide, Shipley Co., Marlborough, Mass.). Results are given in Table 5.

TABLE 5

Lithographic performance of dual tone resists.

| Resist | PEB temp. (C.) | $E_0$ (mJ/cm$^2$) | Positive γ | $E_{n50}$ (mJ/cm$^2$) | Negative γ |
|---|---|---|---|---|---|
| 25217 | 140 | 3.2 | 4.2 | 17.3 | 7.1 |
| 25218 | 140 | 2.1 | 2.7 | 4.5 | 6.3 |
| 25219 | 140 | 2.2 | 2.9 | 15.4 | 14.5 |
| 25220 | 140 | 1.1 | 1.0 | 5.8 | 6.8 |

The results show that a dual tone resist can be prepared and that the resist shows negative behavior. The resist sensitivity for both positive and negative behavior is sufficiently high to allow high throughput manufacturing of integrated circuits. The results also show that the resist has sufficient contrast in both the positive and negative tone to expect high resolution imaging.

While the present invention has been described in terms of specific methods, structures, and devices it is understood that variations and modifications will occur to those skilled in the art upon consideration of the present invention. For example, the methods and compositions discussed herein can be utilized beyond lithography for electronic materials production. As well, the features illustrated or described in connection with one embodiment can be combined with the features of other embodiments. Such modifications and variations are intended to be included within the scope of the present invention. Those skilled in the art will appreciate, or be able to ascertain using no more than routine experimentation, further features and advantages of the invention based on the above-described embodiments. Accordingly, the invention is not to be limited by what has been particularly shown and described, except as indicated by the appended claims. All publications and references are herein expressly incorporated by reference in their entirety. The terms "a" and "an" can be used interchangeably, and are equivalent to the phrase "one or more" as utilized in the present application.

What is claimed is:

1. A method for forming a pattern with a resist to perform lithography, comprising:
    applying a multi-tone resist on a substrate, the multi-tone resist comprising an acid generator and an aliphatic polymer, the aliphatic polymer having acid labile groups and a plurality of crosslinking sites bearing crosslinkable groups capable of crosslinking the aliphatic polymer, the crosslinkable groups comprising at least one of a crosslinkable hydroxide and a latent crosslinkable hydroxide;
    providing a first portion of the resist with exposure to a low dose of lithographic radiation, the low dose being less than a threshold amount wherein the acid labile groups maintain coupling to the aliphatic polymer, and the exposed first portion having limited solubility in a developer;
    selectively exposing a second portion of the resist to an intermediate dose of lithographic radiation, the intermediate dose being capable of activating removal of the acid labile groups, the exposed second portion being substantially soluble in the developer;
    selectively exposing a third portion of the resist to a higher dose of lithographic radiation, the higher dose being capable of inducing crosslinking of the aliphatic polymer at the plurality of crosslinking sites, the exposed third portion having limited solubility in the developer;
    contacting the resist with the developer to form the pattern.

2. The method of claim 1, wherein the multi-tone resist has an absorbance of less than about 5 μm$^{-1}$ when exposed to electromagnetic radiation having a wavelength between about 190 nm and about 195 nm.

3. The method claim 1, wherein the multi-tone resist further comprises: a crosslinking agent capable of promoting crosslinking of the aliphatic polymer, the multi-tone resist having an absorbance of less than about 10 $\mu m^{-1}$ for at least one wavelength of electromagnetic radiation below about 200 nm, wherein the aliphatic polymer comprises a fluoroaliphatic polymer.

4. The method of claim 3, wherein the fluoroaliphatic polymer comprises at least a partially fluorinated cyclic group.

5. The multi-tone resist composition of claim 4, wherein the at least partially fluorinated cyclic group includes the acid labile group.

6. The method of claim 3, wherein the fluoroaliphatic polymer comprises a portion having crosslinkable groups.

7. The method of claim 3, wherein the multi-tone resist has an absorbance of less than about 5 $\mu m^{-1}$ when exposed to electromagnetic radiation having a wavelength between about 155 nm and about 160 nm.

8. The method of claim 1, wherein the steps of providing a first portion of the resist with exposure to lithographic radiation, and selectively exposing a second portion of the resist are performed using a single lithographic radiation exposure.

9. The method of claim 1, wherein the lithographic radiation doses are each characterized by electromagnetic radiation, electron beam radiation, or ion-beam radiation.

10. The method of claim 9, wherein the doses of lithographic radiation are characterized as electromagnetic radiation having a wavelength below about 200 nm.

11. The method of claim 10, wherein the doses of lithographic radiation are characterized as electromagnetic radiation having a wavelength between about 190 nm and 195 nm.

12. The method of claim 10, wherein the doses of lithographic radiation are characterized as electromagnetic radiation having a wavelength between about 155 nm and 160 nm.

13. The method of claim 1, wherein the multi-tone resist has an absorption below about 10$\mu m^{-1}$ for light having at least one wavelength below about 200 nm.

14. The method of claim 1, wherein the aliphatic polymer comprises an aliphatic acrylate portion.

15. The method of claim 14, wherein the aliphatic acrylate portion comprises at least some of the acid-labile groups.

16. The method of claim 14, wherein the aliphatic acrylate portion comprises an aliphatic methacrylate portion.

17. The method of claim 1, wherein the aliphatic polymer comprises a fluoropolymer.

18. The method of claim 1, wherein the step of selectively exposing the third portion comprises transesterifying the plurality of crosslinkable groups to crosslink the aliphatic polymer.

19. The method of claim 1, wherein the multi-tone resist further comprises a crosslinking agent.

20. The method of claim 1, wherein the step of selectively exposing the third portion further comprises reacting a crosslinking agent with the aliphatic polymer at the plurality of crosslinking sites.

21. The method of claim 1, wherein the multi-tone resist further comprises a base generator.

* * * * *